United States Patent
Liu et al.

(10) Patent No.: US 10,871,647 B2
(45) Date of Patent: Dec. 22, 2020

(54) APPARATUS AND METHOD FOR PREVENTION OF CONTAMINATION ON COLLECTOR OF EXTREME ULTRAVIOLET LIGHT SOURCE

(71) Applicant: TAIWAN SEMICONDUCTOR MANUFACTURING CO., LTD., Hsinchu (TW)

(72) Inventors: Kuo-An Liu, Hsinchu (TW); Gwan-Sin Chang, Hsinchu (TW); Bharath Kumar Pulicherla, Hsinchu (TW); Li-Jui Chen, Hsinchu (TW); Sheng-Kang Yu, Hsinchu (TW); Chung-Cheng Wu, Ju-Bei (TW); Zhiqiang Wu, Chubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/517,511

(22) Filed: Jul. 19, 2019

(65) Prior Publication Data
US 2020/0041783 A1    Feb. 6, 2020

Related U.S. Application Data

(60) Provisional application No. 62/712,704, filed on Jul. 31, 2018.

(51) Int. Cl.
*G02B 27/00* (2006.01)
*H05G 2/00* (2006.01)
*G21K 1/06* (2006.01)

(52) U.S. Cl.
CPC .......... *G02B 27/0006* (2013.01); *G21K 1/06* (2013.01); *H05G 2/008* (2013.01); *H05G 2/005* (2013.01)

(58) Field of Classification Search
USPC .................................................. 250/504 R
See application file for complete search history.

(56) References Cited

U.S. PATENT DOCUMENTS

| | | | | |
|---|---|---|---|---|
| 2008/0267816 A1* | 10/2008 | Ueno | ...................... | B08B 17/02 422/24 |
| 2010/0243922 A1* | 9/2010 | Asayama | ............... | H05G 2/003 250/504 R |
| 2011/0222040 A1* | 9/2011 | Steinhoff | ............... | H05G 2/003 355/67 |
| 2013/0313423 A1* | 11/2013 | Umstadter | ............. | H05G 2/008 250/282 |

* cited by examiner

*Primary Examiner* — Kiet T Nguyen
(74) *Attorney, Agent, or Firm* — McDermott Will & Emery LLP

(57) ABSTRACT

An EUV collector mirror for an extreme ultra violet (EUV) radiation source apparatus includes an EUV collector mirror body on which a reflective layer as a reflective surface is disposed, a trajectory correcting device attached to or embedded in the EUV collector mirror body and a trajectory correcting device to adjust the trajectory of metal from the reflective surface of the EUV collector mirror body to an opposite side of the EUV collector mirror body.

20 Claims, 12 Drawing Sheets

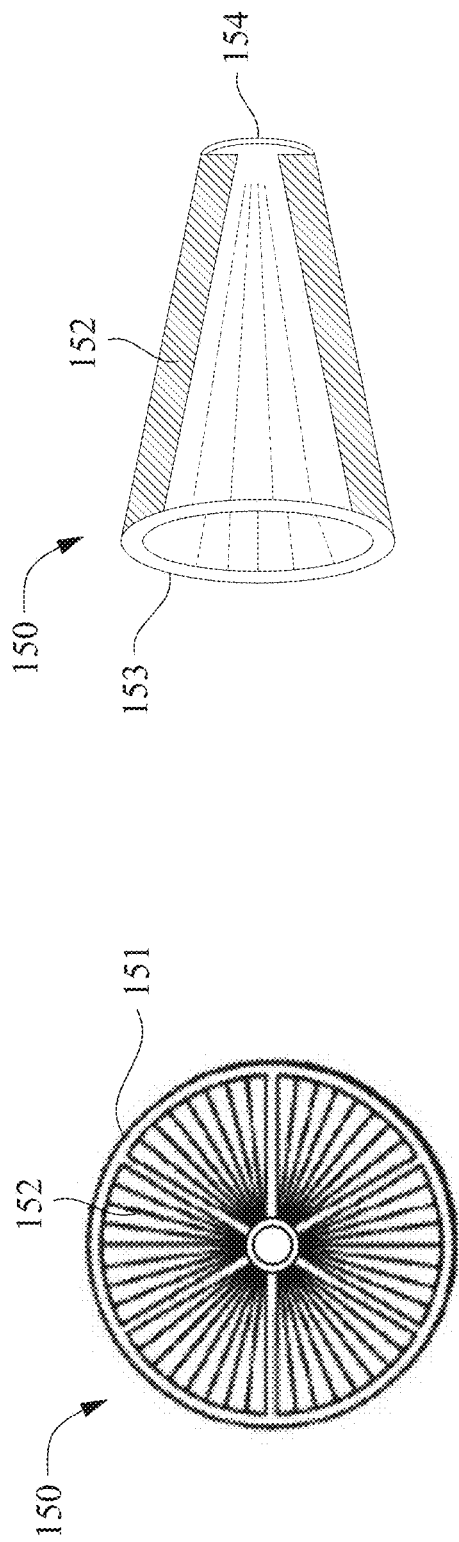
FIG. 2B
FIG. 2A
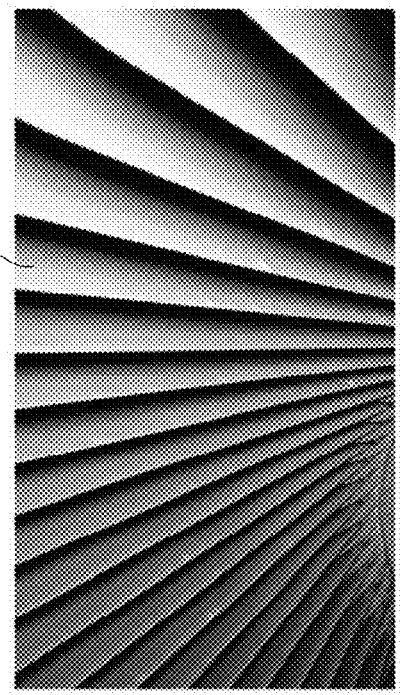
FIG. 2C

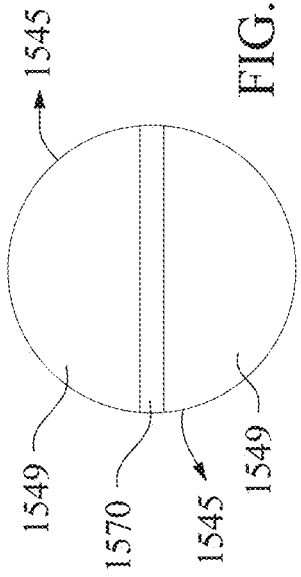
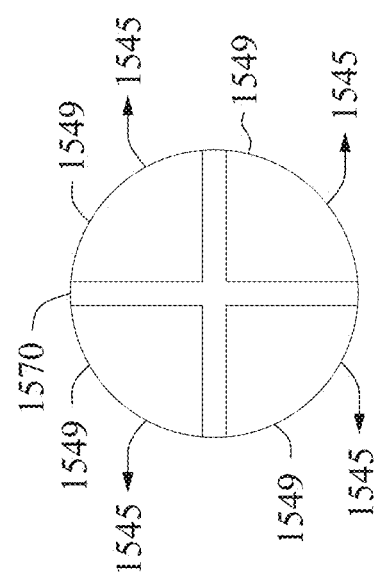
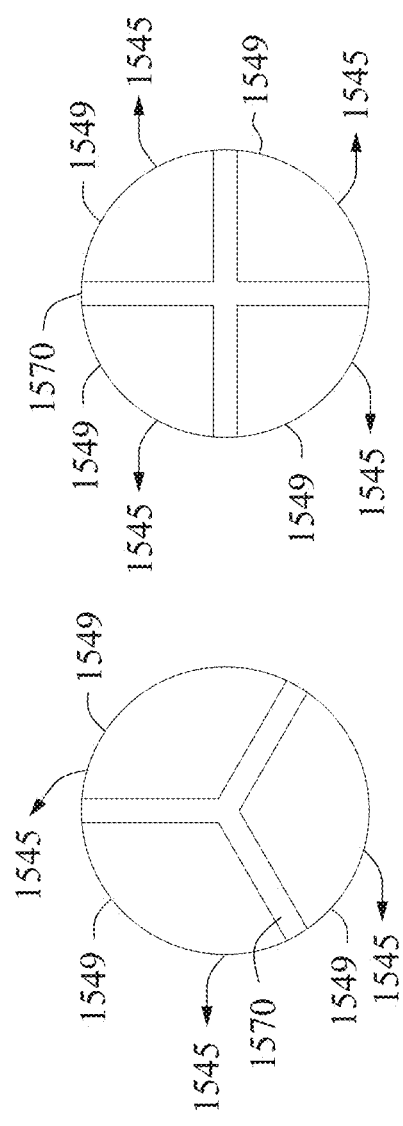
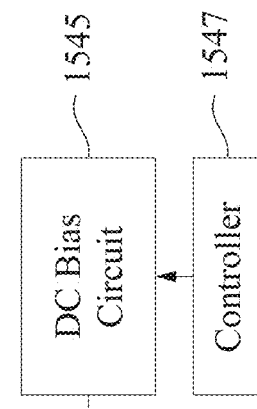
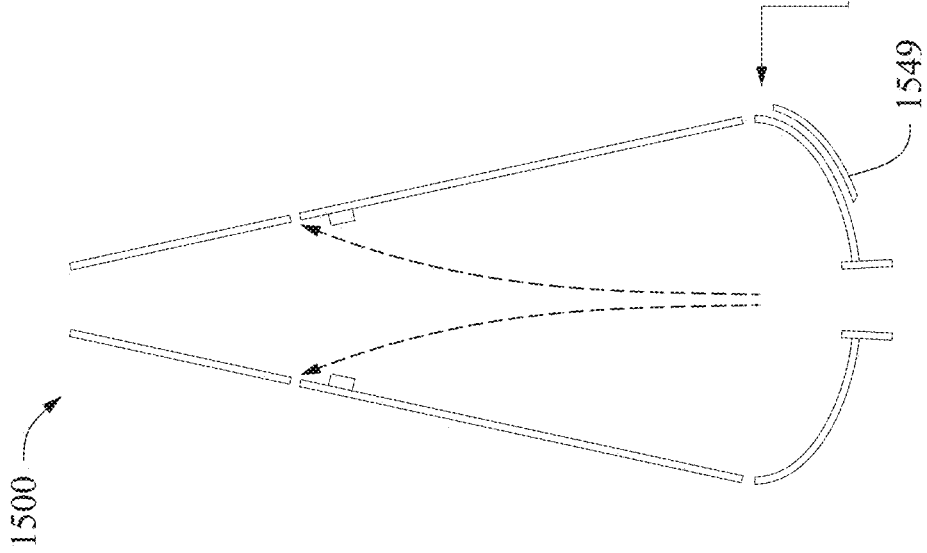

ions deposited on the collector mirror surface. As a result, cleaning or replacement of the EUV collector mirror is required to maintain the reflectivity.

APPARATUS AND METHOD FOR PREVENTION OF CONTAMINATION ON COLLECTOR OF EXTREME ULTRAVIOLET LIGHT SOURCE

RELATED APPLICATION

This application claims priority to U.S. Provisional Patent Application No. 62/712,704 filed on Jul. 31, 2018, the entire content of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide 4×reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP EUV collector mirror and reflected by optics towards a lithography target, e.g., a wafer. The LPP EUV collector mirror is subjected to damage and degradation due to the impact of particles, ions, radiation, and most seriously, tin deposition.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a schematic front view of a debris collection mechanism used in the EUV radiation source according to some embodiments of the present disclosure. FIG. 2B is a schematic side view of a debris collection mechanism used in the EUV radiation source according to some embodiments of the present disclosure. FIG. 2C is a partial picture of a vane used in the EUV radiation source according to some embodiments of the present disclosure.

FIGS. 5A, 5B, 5C, 5D, 5E, 5F, 5G and 5H show schematic views of an EUV collector vessel according to embodiments of the present disclosure. FIGS. 5E, 5F, and 5G are detailed views of various isolated electrode regions.

DETAILED DESCRIPTION

Figure 1:
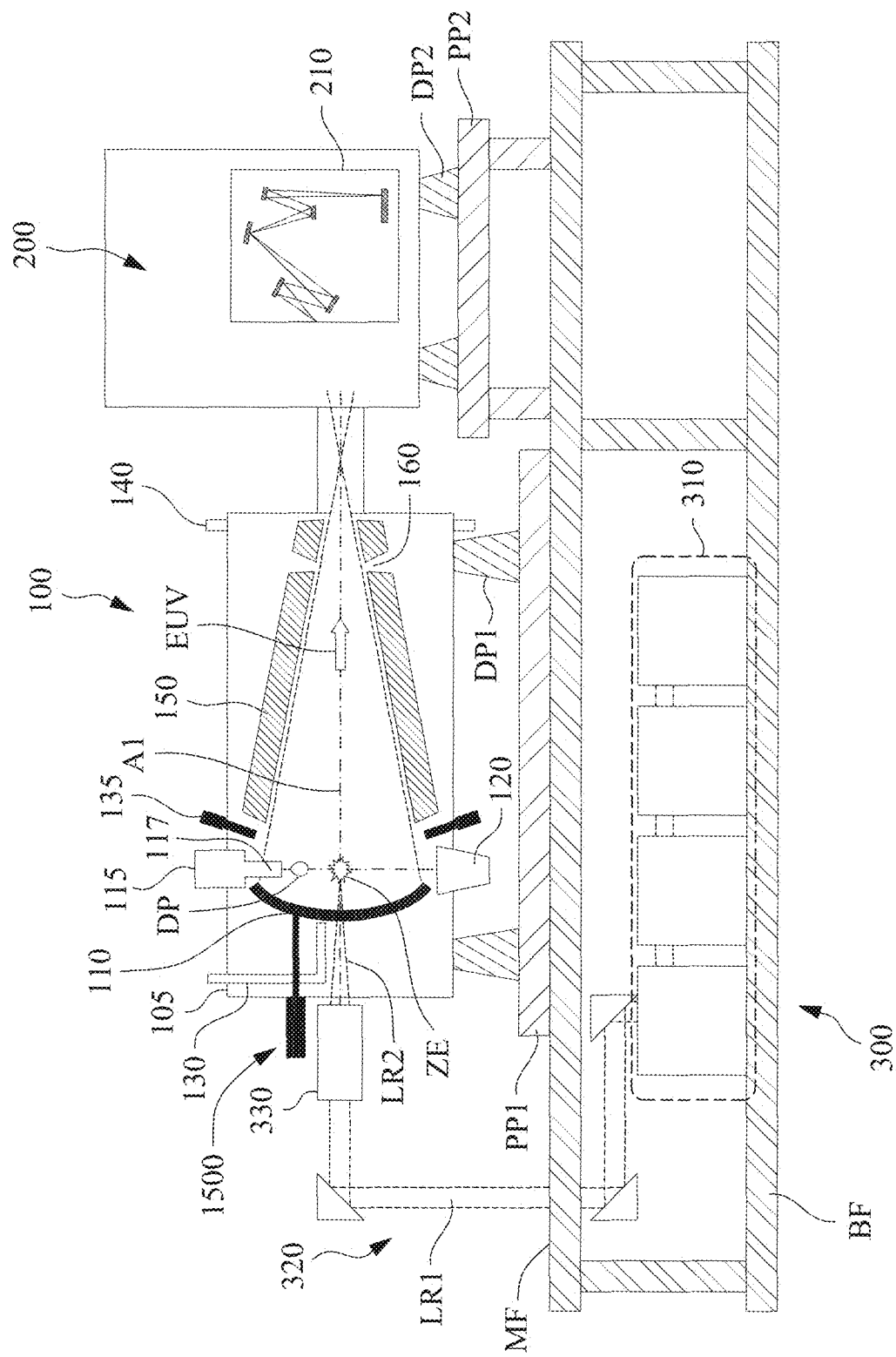
FIG. 1 is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography system and methods. More particularly, it is related to apparatus and methods for mitigating contamination on an EUV collector mirror in a laser produced plasma (LPP) EUV radiation source. The EUV collector mirror, also referred to as an LPP EUV collector mirror or an EUV collector mirror, is a component of the LPP EUV radiation source. It collects and reflects EUV radiation and contributes to overall EUV conversion efficiency. However, it is subjected to damage and degradation due to the impact of particles, ions, radiation, and debris deposition. In particular, tin (Sn) debris is one of the contamination sources of the EUV collector mirror. EUV collector mirror life time, the time duration where the reflectivity decays to half of the initial reflectivity, is one of the factors for an EUV scanner. The major reason of reflectivity decay of the EUV collector mirror is residual metal contamination (tin debris) on the EUV collector mirror surface caused, inevitably, by the EUV light generation procedure.

FIG. 1 is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module 210 for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image onto the resist.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP EUV collector mirror 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (µm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 µm or less, and the main laser pulses have a spot size about 200-300 µm.

The excitation laser (laser pulses) LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The excitation laser (laser light) LR1 generated by the laser generator 300 is guided by the laser guide optics 320 and focused into the excitation laser LR2 by the focusing apparatus 330, and then introduced into the EUV radiation source 100.

The excitation laser (laser light) LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the EUV collector mirror 110. The EUV collector mirror 110 further reflects and focuses the EUV radiation for the lithography exposing processes. In some embodiments, a droplet catcher 120 is installed opposite the target droplet generator 115. The droplet catcher 120 is used for catching excessive target droplets. For example, some target droplets may be purposely missed by the laser pulses.

The EUV collector mirror 110 is designed with a proper coating material and shape to function as a mirror for reflection, and focusing. In some embodiments, the EUV collector mirror 110 is designed to have an ellipsoidal geometry. In some embodiments, the coating material of the EUV collector mirror 110 is similar to the reflective multi-layer of the EUV mask. In some examples, the coating material of the EUV collector mirror 110 includes a ML (such as a plurality of Mo/Si film pairs) and may further include a capping layer (such as Ru) coated on the ML to substantially reflect the EUV light. In some embodiments, the EUV collector mirror 110 may further include a grating structure designed to effectively scatter the laser beam directed onto the EUV collector mirror 110. For example, a silicon nitride layer is coated on the EUV collector mirror 110 and is patterned to have a grating pattern.

In such an EUV radiation source apparatus, the plasma caused by the laser application creates physical debris, such as ions, gases and atoms of the droplet, as well as the desired EUV radiation. It is necessary to prevent the accumulation of material on the EUV collector mirror 110 and also to prevent physical debris exiting the chamber 105 and entering the exposure tool 200.

As shown in FIG. 1, in some embodiments, a buffer gas is supplied from a first buffer gas supply 130 through the aperture in the EUV collector mirror 110 by which the pulse laser is delivered to the tin droplets. In some embodiments, the buffer gas is $H_2$, He, Ar, N or another inert gas. In certain embodiments, $H_2$ is used as H radicals generated by ionization of the buffer gas can be used for cleaning purposes. The buffer gas can also be provided through one or more second buffer gas supplies 135 toward the EUV collector mirror 110 and/or around the edges of the EUV collector mirror 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the EUV collector mirror 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To prevent the $SnH_4$ or other debris deposition on the EUV collector mirror 110, one or more debris collection mechanisms 150 are employed in the chamber 105.

As shown in FIG. 1, one or more debris collection mechanisms 150 are disposed along optical axis A1 between the zone of excitation ZE and an output port 160 of the EUV radiation source 100. FIG. 2A is a front view of the debris collection mechanism 150 and FIG. 2B is a schematic side view of debris collection mechanism 150. FIGS. 2A to 2C is a partial picture of the debris collection mechanism 150. The debris collection mechanism 150 includes a frustoconical support frame 151, a first end support 153 and a second end support 154 that operably support a plurality of vanes 152 that rotate within the housings. The first end support 153 has a larger diameter than the second end support 154. The debris collection mechanism 150 serves to prevent the surface of the EUV collector mirror 110 and/or other elements/portions of the inside the chamber 105 from being coated by Sn vapor by repelling slow Sn atoms and/or $SnH_4$.

The plurality of vanes 152 project radially inwardly from the frustoconical support frame 151. The vanes 152 are thin and elongate plates. In some embodiments, each of the vanes has a triangular or trapezoid or trapezium shape in plan view. The vanes 152 are aligned so that their longitudinal axes are parallel to the optical axis A1 so that they present the smallest possible cross-sectional area to the EUV radiation EUV. The vanes 152 project towards the optical axis A1, but do not extend as far as the optical axis. In some embodiments, a central core of the debris collection mechanisms 150 is empty. The debris collection mechanisms 150 is rotated by a drive unit including one or more motors, one or more belts and/or one or more gears, or any rotating mechanism.

One mechanism for preventing gaseous tin and/or gaseous $SnH_4$ from depositing on the EUV collector mirror 110 is applying a magnetic field. In some embodiments, superconducting magnets are placed on either side of the EUV collector mirror 110 to generate a strong magnetic field and confine the plasma in a direction perpendicular to the magnetic field. However, the plasma may not be completely confined in a direction parallel to the magnetic field, resulting in deposition of tin 70 and/or $SnH_4$ near the magnets.

Figures 3A, 3B:
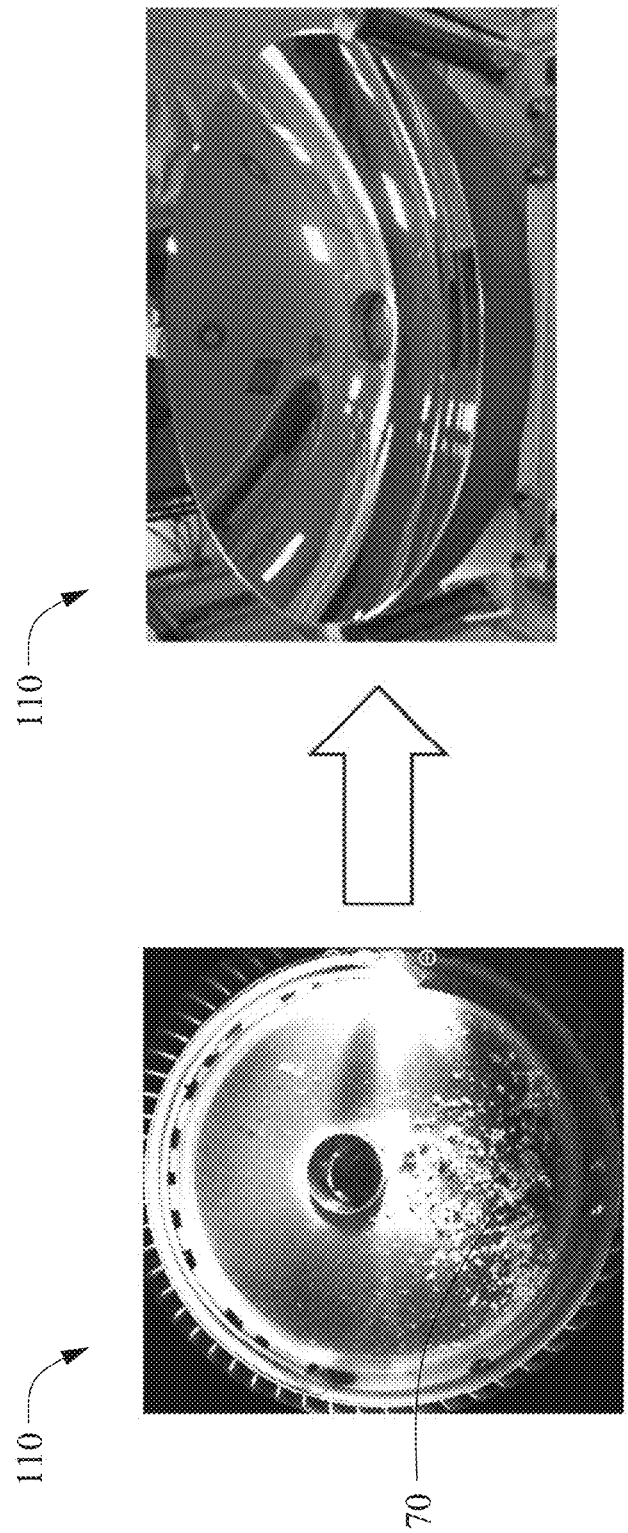
FIG. 3A shows an EUV collector mirror after use, on which tin debris are deposited.
FIG. 3B shows an EUV collector mirror after cleaning the surface thereof.

FIG. 3A shows the EUV collector mirror 110 after use, on which tin debris are deposited, and FIG. 3B shows the EUV collector mirror 110 after cleaning the surface thereof.

As set forth above, the EUV collector mirror 110 contamination by the residual metal from the EUV light generation procedure is the major cause of the EUV scanner exposure power loss and throughput down trend. The EUV collector mirror life time is maintained at about 3 months, for example, and then it is generally necessary for a week or more of down time to swap the EUV collector mirror 110 with a new, clean EUV collector mirror to maintain high exposure power and throughput.

While the magnetic field can be helpful to reduce collector mirror contamination, it may not result in sufficient prevention of deposition of tin and/or $SnH_4$ on the EUV collector mirror 110. It is to be noted that because of space constraints caused by positioning of the droplet generator, droplet catcher and other components near the EUV collector mirror 110, it is generally difficult to place additional superconducting magnets around the EUV collector mirror 110, especially given that the superconducting magnets tend to be fairly large in size because of accompanying cooling and electric systems. Thus, alternative methods for prevention of the EUV collector mirror contamination may be beneficial.

Figure 4:
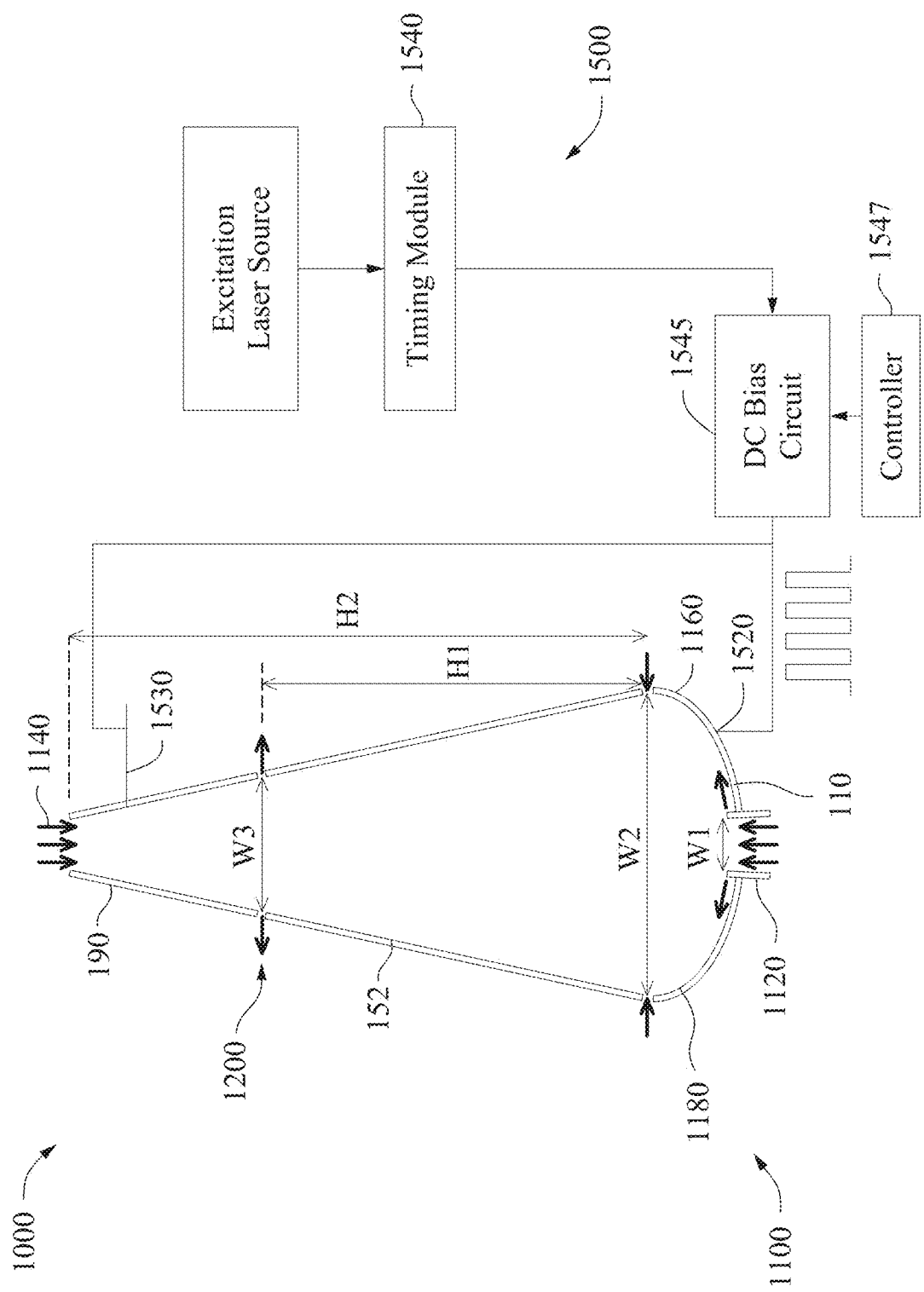
FIG. 4 shows a schematic view of an EUV collector vessel according to an embodiment of the present disclosure.

As shown in FIG. 4, the EUV vessel 1000 includes a plurality of inlet ports 1100 and exhaust ports 1200 for receiving and transmitting cleaning gas. In some embodiments, the plurality of inlet ports 1100 include a first cleaning gas port 1120, a second cleaning gas port 1140, and third and fourth cleaning gas ports 1160, 1180. The EUV vessel 1000 includes one or more exhaust ports 1200 so that the cleaning gas is exhausted outside the EUV vessel 1000. In some embodiments, a width W1 is in the range from about 80 mm to about 100 mm. In some embodiments, a width W2 is in the range from about 710 mm to about 750 mm. In some embodiments, a width W3 is in the range from about 340 mm to about 380 mm. In some embodiments, a height H1 is in the range from about 950 mm to about 1000 mm. In some embodiments, a height H2 is in the range from about 1310 mm to about 1360 mm. While the EUV vessel 1000 shown in FIG. 4 includes the above inlet and outlet ports, alternate embodiments of the EUV vessel 1000 may include a different number and/or arrangement of inlet and/or outlet ports.

Hydrogen gas has low absorption to the EUV radiation. Hydrogen gas reaching to the coating surface of the EUV collector mirror 110 reacts chemically with a metal of the droplet forming a hydride, e.g., metal hydride. When tin (Sn) is used as the droplet, Sn ions and/or stannane ($SnH_4$), which is a gaseous byproduct of the EUV generation process, is formed. The gaseous $SnH_4$ is then pumped out through the exhaust ports 1200. However, it is difficult to exhaust all gaseous $SnH_4$ from the chamber and to prevent the $SnH_4$ from contaminating the collector mirror 110.

In some embodiments, the EUV vessel 1000 includes a trajectory correcting device 1500 connected to the EUV collector mirror 110. In some embodiments, the trajectory correcting device 1500 includes one or more first charging point 1520 embedded in the EUV collector mirror 110 and a second charging point 1530 attached to a lower cone 190 of the EUV radiation source 100. In some embodiments, the first charging point 1520 embedded in the EUV collector mirror 110 is provided with a higher electrical potential than the electrical potential at the second charging point 1530 attached to the lower cone 190 of the EUV radiation source 100. In alternative embodiments, it is possible to provide a lower electrical potential to the first charging point 1520 than the electrical potential at the second charging point 1530 attached to the lower cone 190 of the EUV radiation source 100. In some embodiments, the first and second charging points 1520, 1530 include Ni—Cr alloy wires and/or Fe—Cr—Al alloy wires. A pulse timing module 1540 provides electric power to the first charging point 1520 via a DC bias circuit 1545 and controls the modulating frequency. In some embodiments, the DC bias circuit 1545 provides a biasing DC voltage to the EUV collector mirror 110. In some embodiments, the DC bias circuit 1545 provides delays the biasing DC voltage. In some embodiments, the DC bias circuit 1545 is connected to a controller 1547 and the biasing DC voltage is controlled by the controller. In other embodiments, the trajectory correcting device 1500 provides an electrical field to the reflective surface and/or the back surface of the EUV collector mirror 110. In some embodiments, the first charging point 1520 is divided into a plurality of sections, which are independently controlled by the pulse timing module 1540. With this feature, it is possible to locally provide an electrical field to a part of the EUV collector mirror 110 where the debris is heavily deposited.

In some embodiments, the EUV collector mirror 110 is provided with a voltage in a range from about 1 Vdc to about 50 Vdc. In other embodiments, the EUV collector mirror 110 is provided with an electric potential equal to 5 V, 20 V, 30 V, 40 V, 50 V, or any other potential between any two of these values. Further, by modulating the voltage, it is possible to create an electric field that causes the tin ions (Sn') to be rapidly redistributed away from the EUV collector mirror 110. In some embodiments, the EUV collector mirror 110 is configured such that a desired direction of the electric field is obtained when the EUV collector mirror 110 is provided with an electric potential so that the electric field causes the tin ions (Sn') to be rapidly redistributed in a direction away from the EUV collector mirror 110 during EUV radiation source operation.

The EUV collector mirror 110 includes one or more pulse timing module 1540 to prevent metal debris (contamination) from depositing on the surface of the EUV collector mirror 110. The trajectory correcting device 1500 provides an electric potential in the EUV collector mirror 110 so that the voltage is adjusted through the pulse timing module 1540. In some embodiments, the pulse timing module includes a configurable pattern of the pulse to adjust the trajectory of the metal debris when necessary. The configurable pattern of the pulse is controlled by control circuitry in some embodiments.

Figure 5A:
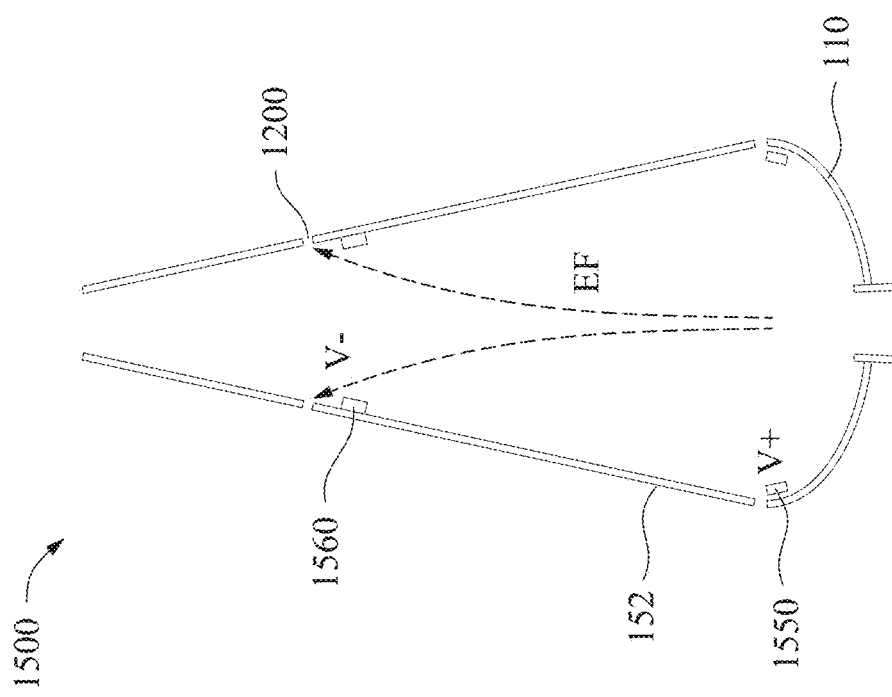
Figure 5B:
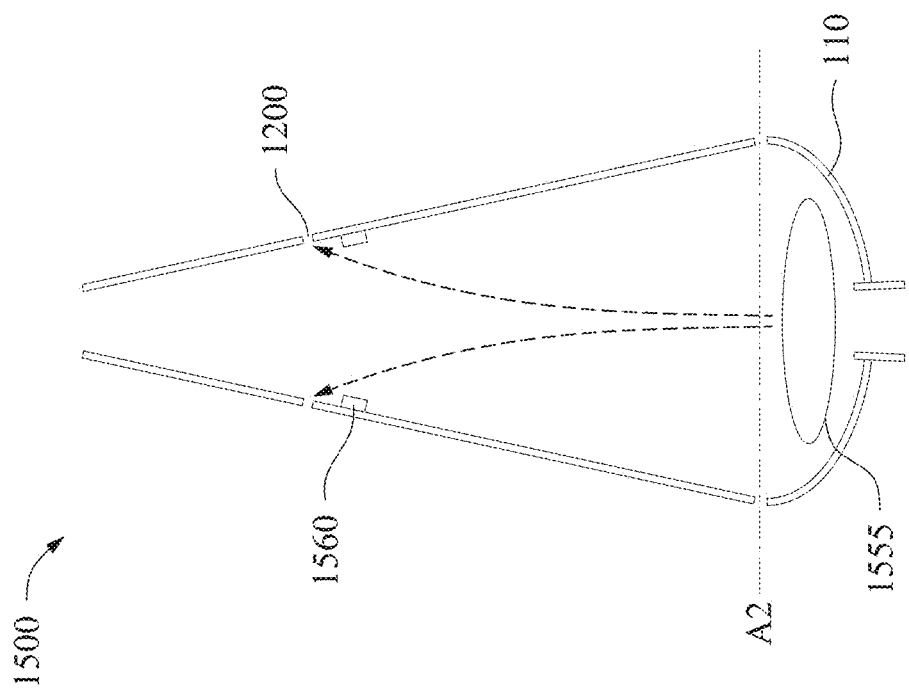
Figure 5C:
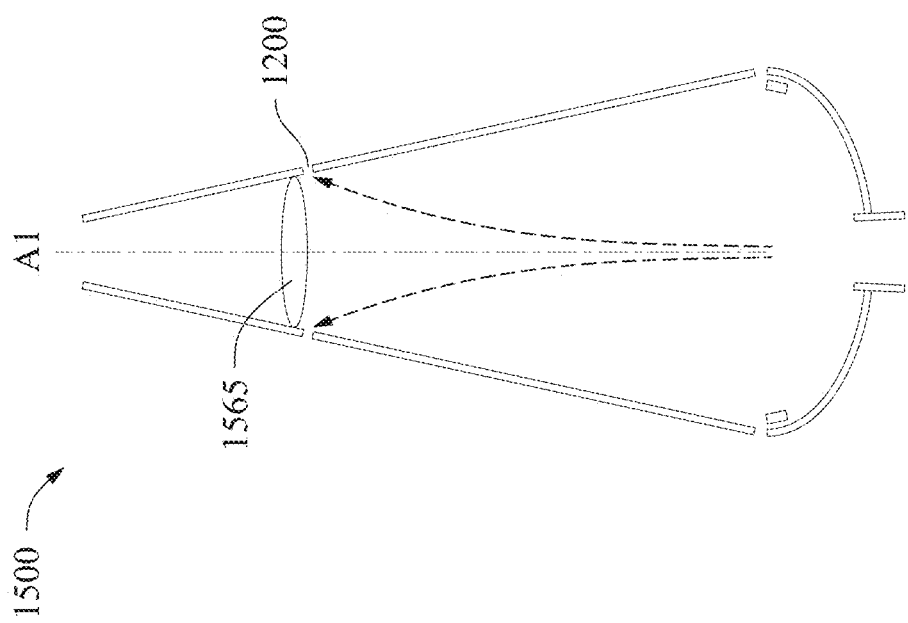

As shown in FIG. 5A, in some embodiments, the trajectory correcting device 1500 may further includes first electrodes 1550 having an electrical potential V+ arranged in the EUV collector mirror 110 adjacent to the vanes 152 to provide an electric field. In some embodiments, the trajectory correcting device 1500 may further include second electrodes 1560 having an electrical potential V− arranged in adjacent to the lower cone 190 of the EUV vessel 1000. In some embodiments, the electrical potential V+ at the first electrodes 1550 is higher than the electrical potential V− at the second electrodes 1560 adjacent to the exhaust ports 1200 of the EUV vessel. In the foregoing embodiment, tin ions ($Sn^{x+}$) are caught by the electric field EF, the first electrodes 1550 and the second electrodes 1560 guide the Sn ions along the electric field and discharge the Sn ions to the exhaust ports 1200. In some embodiments as shown in FIG. 5B, the first electrodes form a mesh structure 1555 in a plan view extending along and adjacent the droplet axis A2. In some embodiments, the mesh structure 1555 has an opening in a center region of a shape such as for example, a donut shape, where the excitation laser beam passes through. In certain embodiments as shown in FIG. 5C, the second electrodes form a ring-shaped structure 1565 adjacent to the lower cone 190 and the exhaust ports 1200 along the optical axis A1.

Figure 5H:
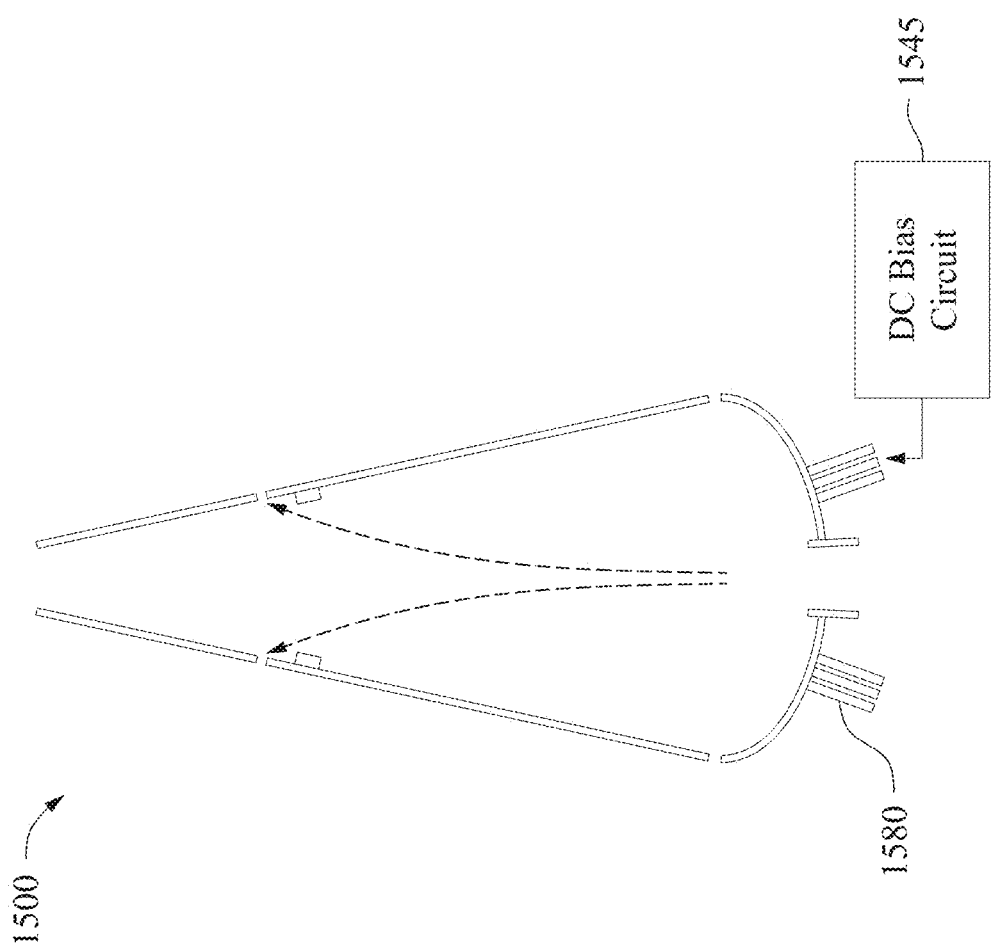

In some embodiments as shown in FIG. 5D, the trajectory correcting device 1500 further includes one or more isolated electrode regions 1549 in the EUV collector mirror 110. FIGS. 5E, 5F, and 5G are detailed views showing different arrangements of the isolated electrode regions 1549 on the back side of the EUV collector mirror 110. The isolated electrode regions 1549 separated by electrically insulating regions 1570 connected to the DC biasing circuit 1545 according to an embodiment of this disclosure. In one or more embodiments, as shown in FIG. 5H, the trajectory correcting device 1500 further includes isolated electrodes 1580 arranged in the EUV collector mirror 110. The isolated electrodes 1580 are a plurality of electrically isolated electrodes 1580 connected to the DC biasing circuit 1545 according to an embodiment of this disclosure. While the specific arrangement are provided for the electrodes disclosed above, these are merely exemplary embodiments and that the present system may utilize any appropriate configuration of the trajectory correcting device 1500. Further, depending upon the application of the present system, specific capabilities of the foregoing electrodes may be required. These various configurations may be contemplated by the present disclosure.

As shown in FIG. 5A, in some embodiments, the trajectory correcting device 1500 may further include first electrodes 1550 arranged adjacent to the EUV collector mirror 110 to provide an electric field. In particular embodiments, such electrodes 1550 may form a mesh structure 1555 in a plan view arranged alongside the droplet axis A2.

Figure 6:
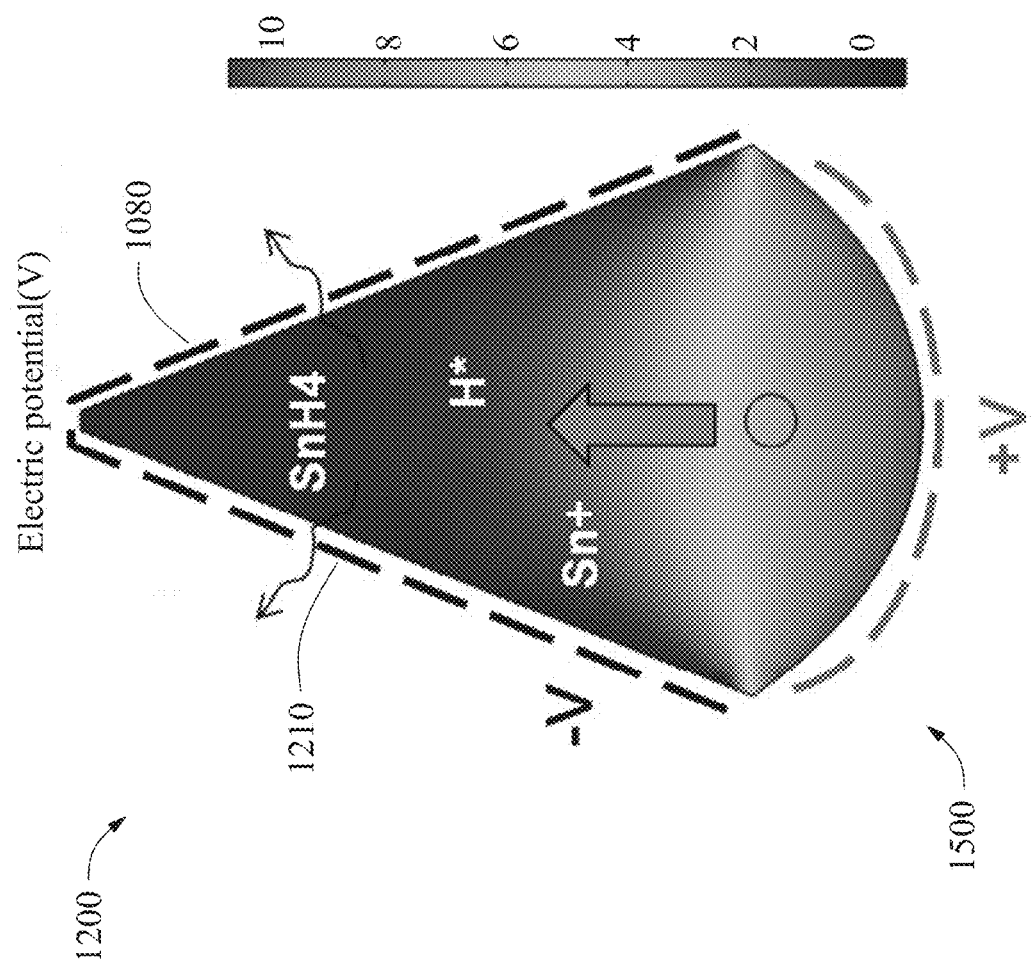
FIG. 6 shows a schematic view of an EUV collector vessel according to an embodiment of the present disclosure.

FIG. 6 shows an exemplary view of the EUV collector vessel 1000 according to an embodiment of the present disclosure. In FIG. 6 the electric field potential across the length of the EUV collector vessel 1000 is illustrated. As shown, in some embodiments, the electric field potential ranges from 10 V adjacent the collector mirror surface to 0

V adjacent the lower cone. In some embodiments, the tin liquid droplet is irradiated by the pre-pulse laser light and then by the carbon dioxide gas laser light to emit EUV light. When tin ions ($Sn^{x+}$) are caught by the electric field, the trajectory correcting device 1500 of this disclosure guides and discharges the Sn ions along the electric field to the exhaust ports 1200. In some embodiments, the exhaust ports 1200 have a debris exhausting structure 1210 provided on an outlet portion 1080 as shown in FIG. 6. The debris exhausting structure 1210 collects the tin ions ($Sn^{x+}$) redistributed away from the EUV collector mirror 110 and guided by the electric field caused by the trajectory correcting device 1500 to the outside of the EUV vessel 1000. Hydrogen gas introduced into the chamber reacts chemically with the tin ions forming a gas, stannane ($SnH_4$). The gaseous $SnH_4$ is then pumped out through the outlet 140.

FIGS. 7A, 7B, 7C, 7D, 7E and 7F show the results of a simulation of the distribution of Sn ions and electrons when no potential is applied to the EUV collector mirror 110.

Figures 7A, 7B, 7C, 7D, 7E, 7F:
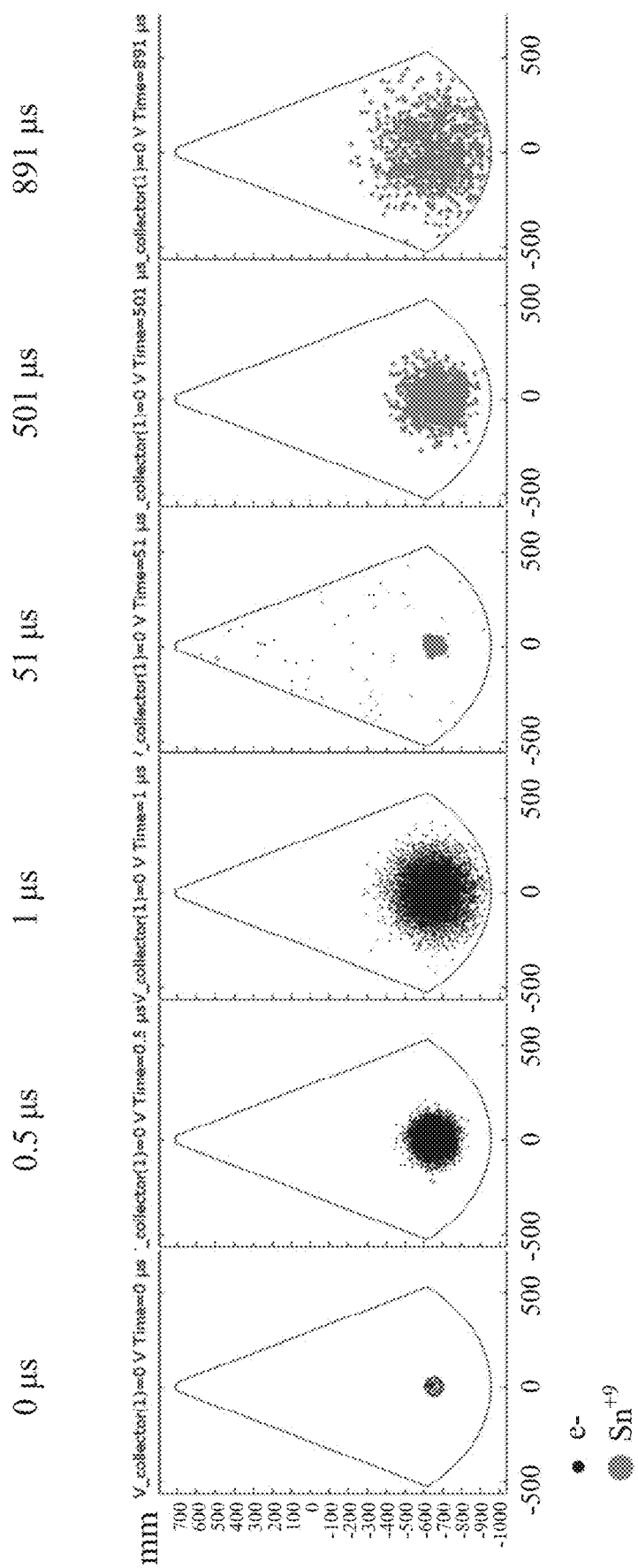
FIGS. 7A, 7B, 7C, 7D, 7E and 7F show results of a simulation of the distribution of Sn ions and electrons when a 0V potential is applied to the EUV collector mirror.

In some embodiments, as shown in FIG. 7A, a laser pulse is arranged with a pre-pulse of 100 ns and a main pulse of 70 ns as shown in FIGS. 7A-7F. An interval between the pre-pulse and the main pulse is in a range of about 20 μs in some embodiments. In some embodiments, the pulse timing module 1540 is connected to the trajectory correcting device 1500 to provide an electrical potential of 0 Vdc. However, the location of the pulse timing module 1540 is not limited to the arrangement of FIG. 4. In some embodiments, the pulse timing module 1540 is located at or near the lowest position of the EUV collector mirror 110 when the EUV collector mirror 110 is installed in an EUV radiation source apparatus.

In some embodiments, FIGS. 7B and 7C illustrate electrons that are spreading radially after about 0.5 μs and 1 μs of time has passed by with no electric field generated by the trajectory correcting device 1500.

After about 51 μs of time has passed from the main laser pulse, as shown in FIG. 7D, tin ions ($Sn^{9+}$) are observed. In some embodiments, FIGS. 7E and 7F illustrate tin ions ($Sn^{9+}$) that are spreading radially after about 501 μs and 891 μs of time has passed by with no electric field generated by the trajectory correcting device 1500.

In some embodiments, as shown in FIG. 7F, the tin ions ($Sn^{9+}$) are located near and adjacent to the EUV collector mirror 110. Therefore, it is likely that gaseous tin and/or gaseous $SnH_4$ will be deposited on the EUV collector mirror 110.

Figures 8A, 8B, 8C, 8D, 8E, 8F:
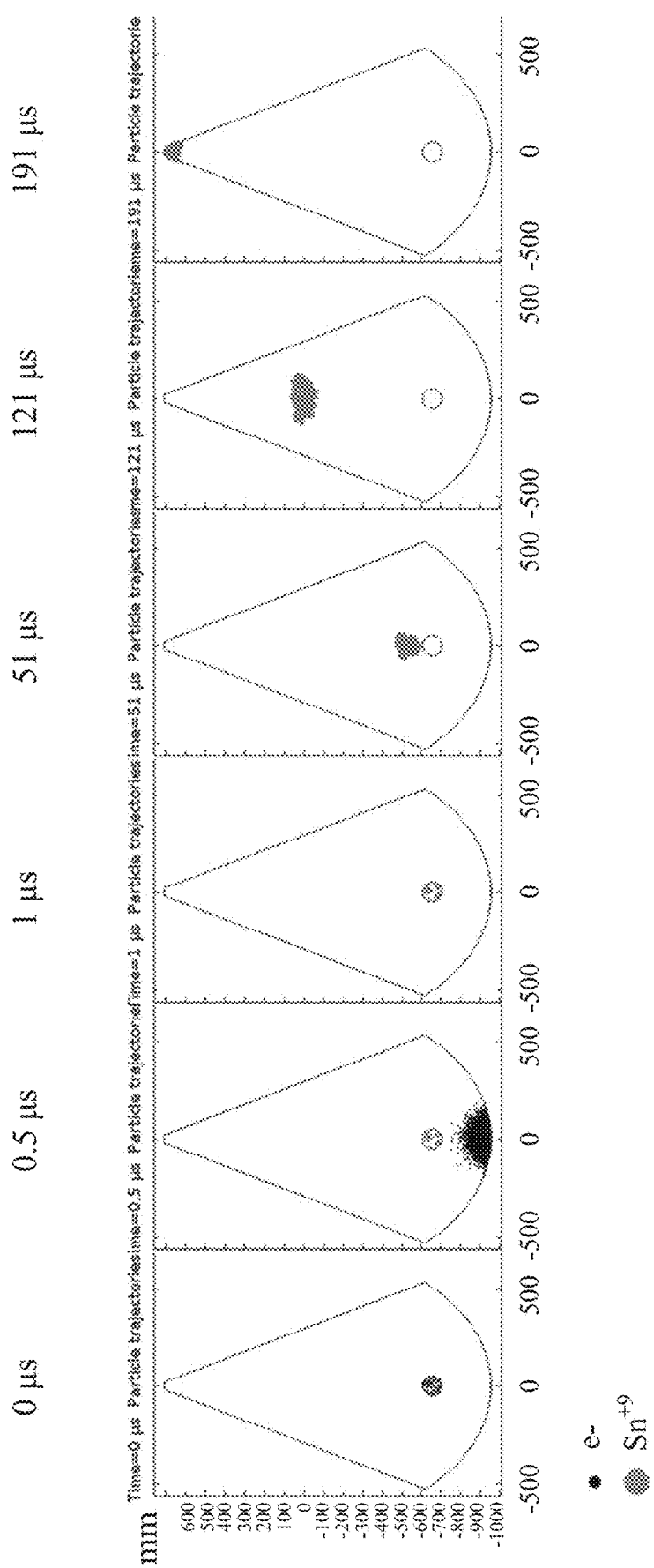
FIGS. 8A, 8B, 8C, 8D, 8E and 8F show results of a simulation of the distribution of Sn ions and electrons when a 10V potential is applied to the EUV collector mirror according to embodiments of the present disclosure.

FIGS. 8A, 8B, 8C, 8D, 8E and 8F show the results of a simulation of the distribution of Sn ions and electrons when a 10V potential is applied to the EUV collector mirror 110 according to embodiments of the present disclosure. As can be seen in FIG. 8B, the EUV collector mirror 110 immediately attracts all the electrons.

FIGS. 8C through 8F illustrate the Sn ions are repelled away from the EUV collector mirror 110 quickly within about 191 μs of time by the electric field with the 10V potential generated by the trajectory correcting device 1500 as illustrated in FIGS. 8C through 8F. In some embodiments, as shown in FIG. 8F, the tin ions ($Sn^{9+}$) are located near and adjacent to the lower cone 190 of the EUV radiation source 100 shown in FIG. 4. In this embodiment, it is likely the gaseous tin and/or gaseous $SnH_4$ formed by the tin reacting with $H_2$ gas will be exhausted through the debris exhausting structure 1210 shown in FIG. 4.

In some embodiments, the application of the potential is synchronized with the main laser pulse so as to prevent the potential from interfering with the plasma reionization process which results in the emission of the EUV radiation. In such embodiments, the electric potential is applied as a pulse after a certain predetermined time period following the arrival of the main laser pulse in the zone of excitation. For example, in an embodiment, the electric potential is applied about 1 μs, about 2 μs, about 5 μs, about 10 μs or any time delay between any two of these values, after the main laser pulse. In some embodiments, a pulse duration of the electric potential is the same as that of the main laser pulse. In some embodiments, the pulse duration of the electric potential is different from that of the main laser pulse.

In some embodiments, the application of the electric potential according to embodiments of this disclosure obviates the need for using superconducting magnets, thereby saving the costs associated with the magnets and their operation. In some embodiments, the application of the electric potential renders the superconducting magnets as a fail-safe mechanism, thereby increasing desired redundancy in the system. The application of the electric potential to the EUV collector mirror 110 of the EUV radiation source prevents deposition of tin on the EUV collector mirror surface and increases the working time of the EUV radiation source, thereby increasing the throughput of the fabrication process. Moreover, because the EUV collector mirror 110 remains contamination free, the efficiency of the EUV radiation source is also increased. In some embodiments, the DC voltage applied to the EUV collector mirror 110 does not heat the EUV collector mirror 110. In other words, the EUV collector mirror 110 is not electrically connected to a potential other than the power supply.

An EUV collector mirror for an extreme ultra violet (EUV) radiation source apparatus includes an EUV collector mirror body on which a reflective layer as a reflective surface is disposed, a trajectory correcting device attached to or embedded in the EUV collector mirror body and a trajectory correcting device to adjust the trajectory of a metal from the reflective surface of the EUV collector mirror body to an opposite side of the EUV radiation source apparatus away from the EUV collector mirror body.

In accordance with one aspect of the present disclosure, an EUV vessel for an extreme ultra violet (EUV) radiation source apparatus includes an EUV collector mirror body, on which a reflective layer as a reflective surface is disposed, and a trajectory correcting device attached to or embedded in the EUV collector mirror body. In some embodiments, the trajectory correcting device is configured adjust the trajectory of metal ion towards an opposite side of the EUV vessel away from the EUV collector mirror body. In some embodiments, the trajectory correcting device includes a pulse timing module coupled to a first charging point at the EUV collector mirror body and a second charging point at a lower cone of the EUV vessel. In some embodiments, a conduit connects the first charging point at the EUV collector mirror body and the pulse timing module. In one or more of the foregoing embodiments, the first charging point is configured to positively bias the collector by applying a voltage in a range from 1 V to 50 V to the collector mirror body. In some embodiments, the pulse timing module is configured to provide an amplitude modulation of the pulse. In other embodiments, the pulse timing module is also configured to provide a frequency modulation of the pulse. In one or more embodiments, the pulse timing module is configured to provide an electric to cause the tin ions to be redistributed in a direction away from the EUV collector mirror body.

In accordance with another aspect of the present disclosure, a method of preventing contamination of a collector of an extreme ultraviolet (EUV) radiation source comprises providing an EUV collector mirror body that a reflective layer is disposed on the EUV collector mirror body as a reflective surface. The method of preventing contamination of a collector also includes providing a trajectory correcting device attached to or embedded in the EUV collector mirror body. The method of preventing contamination of a collector further includes applying an electric field to an EUV collector mirror body in order to adjust the trajectory of metal debris towards an opposite side of the EUV radiation source away from the EUV collector mirror body. In some embodiments, the method providing the trajectory correcting device includes a pulse timing module that is coupled to a first charging point at the EUV collector mirror body and a second charging point at a lower cone of the EUV vessel. In some embodiments, the first charging point at the EUV collector mirror body is connected to the pulse timing module by a conduit. In some embodiments, the method further comprises positively biasing the collector by applying a voltage in a range from 1 V to 50 V to the EUV collector mirror body. In some embodiments, the method further comprises positively biasing the collector by applying a voltage in a range from 1 V to 50 V to the EUV collector mirror body. In some embodiments, the method further comprises modulating the amplitude of the voltage using the pulse timing module. In some embodiments, the method further comprises modulating a frequency of voltage pulses using the pulse timing module.

In accordance with another aspect of the present disclosure, an extreme ultra violet (EUV) radiation source apparatus comprises a chamber enclosing an EUV vessel. In some embodiments, the EUV vessel comprises a collector mirror configured to reflect EUV radiation, a debris collection mechanism disposed over the collector mirror and a lower cone disposed over the debris collection mechanism. In some embodiments, the EUV vessel also comprises at least one first charging point attached to the collector mirror and a second charging point attached to the lower cone. In some embodiments, a pulse timing module and a DC bias circuit are coupled to the first charging point and the second charging point. In some embodiments, the timing module, DC bias circuit, and the first charging point are configured to positively bias the collector by applying a voltage in a range from 1 V to 50 V to the collector mirror. In some embodiments, the pulse timing module modulates a frequency and amplitude of the modulation of a DC pulse that is applied to the collector mirror. In some embodiments, the at least one charging points are attached to the collector mirror adjacent to vanes of the debris collection mechanism. In some embodiments, the EUV radiation source apparatus further comprises isolated electrode regions on a rear side of an EUV collector mirror. In some embodiments, the isolated electrode regions are separated by electrically insulating regions.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An EUV vessel for an extreme ultra violet (EUV) radiation source apparatus, comprising:
    an EUV collector mirror body on which a reflective layer as a reflective surface is disposed; and
    a trajectory correcting device attached to or embedded in the EUV collector mirror body,
    wherein the trajectory correcting device is configured to adjust a trajectory of metal ions towards an opposite side of the EUV vessel away from the EUV collector mirror body, and
    wherein the trajectory correcting device includes a pulse timing module coupled to a first charging point at the EUV collector mirror body.

2. The EUV vessel of claim 1, wherein a conduit connects the first charging point at the EUV collector mirror body and the pulse timing module.

3. The EUV vessel of claim 1, wherein the first charging point is configured to positively bias the collector mirror body by applying a voltage in a range from 1 V to 50 V to the collector mirror body.

4. The EUV vessel of claim 1, wherein the pulse timing module is configured to provide an amplitude modulation of the pulse.

5. The EUV vessel of claim 1, wherein the pulse timing module is configured to provide a frequency modulation of the pulse.

6. The EUV vessel of claim 1, wherein the pulse timing module is configured to provide an electric field to cause the metal ions to be redistributed in a direction away from the EUV collector mirror body.

7. The EUV vessel of claim 1, wherein the trajectory correcting device includes a pulse timing module coupled to a second charging point at a lower cone of the EUV vessel, the lower cone being opposite from the collector and adjacent to exhaust ports.

8. A method of preventing contamination of a collector of an extreme ultraviolet (EUV) radiation source, the method comprising:
    providing an EUV collector mirror body on which a reflective layer as a reflective surface is disposed; and
    providing a trajectory correcting device attached to or embedded in the EUV collector mirror body; and
    applying an electric field to an EUV collector mirror body to adjust a trajectory of metal debris towards an opposite side of the EUV radiation source away from the EUV collector mirror body,
    wherein the trajectory correcting device includes a pulse timing module coupled to a first charging point at a lower cone of an EUV vessel, the lower cone being opposite from the collector and adjacent to exhaust ports.

9. The method of claim 8, wherein the first charging point at the EUV collector mirror body is connected to the pulse timing module by a conduit.

10. The method of claim 8, further comprising positively biasing the collector mirror body by applying a voltage in a range from 1 V to 50 V to the EUV collector mirror body.

11. The method of claim 8, further comprising modulating an amplitude of voltage pulses using the pulse timing module.

12. The method of claim 8, further comprising modulating a frequency of voltage pulses using the pulse timing module.

13. The method of claim 8, wherein the pulse timing module provides the electric field to the EUV collector mirror body.

14. The method of claim 8, wherein the trajectory correcting device includes a pulse timing module coupled to a second charging point at the EUV collector mirror body.

15. An extreme ultraviolet (EUV) radiation source, comprising:
- a chamber enclosing an EUV vessel,
  the EUV vessel comprising:
  - a collector mirror configured to reflect EUV radiation;
  - a debris collection mechanism disposed over the collector mirror;
  - a lower cone disposed over the debris collection mechanism;
  - at least one first charging point attached to the collector mirror;
  - a second charging point attached to the lower cone; and
  - a pulse timing module and a DC bias circuit coupled to the first charging point and the second charging point.

16. The EUV radiation source of claim 15, wherein the pulse timing module, DC bias circuit, and the first charging point are configured to positively bias the collector mirror by applying a voltage in a range from 1 V to 50 V to the collector mirror.

17. The EUV radiation source of claim 16, wherein the pulse timing module modulates a frequency and amplitude of the modulation of a DC pulse applied to the collector mirror.

18. The EUV radiation source of claim 16, wherein the at least one first charging point is attached to the collector mirror adjacent to vanes of the debris collection mechanism.

19. The EUV radiation source of claim 16, further comprising isolated electrode regions on a rear side of an EUV collector mirror.

20. The EUV radiation source of claim 19, wherein the isolated electrode regions are separated by electrically insulating regions.

* * * * *